United States Patent

Livezey et al.

[15] 3,651,383

[45] Mar. 21, 1972

[54] UNITARY HIGH POWER SEMICONDUCTOR SUBASSEMBLY SUITABLE FOR MOUNTING ON A SEPARABLE HEAT SINK

[72] Inventors: John P. Livezey, Broomall; Daniel B. Rosser, Springfield, both of Pa.

[73] Assignee: General Electric Company

[22] Filed: Feb. 5, 1970

[21] Appl. No.: 8,887

[52] U.S. Cl. ...................317/234 R, 317/234 A, 317/234 G, 317/234 N, 317/234 P

[51] Int. Cl. .......................................H01l 3/00, H01l 5/00

[58] Field of Search ....................317/234, 235, 100, 99, 1, 4, 317/4.1, 5, 5.4, 6, 11; 174/15; 29/589, 590, 591

[56] References Cited

UNITED STATES PATENTS

| | | | |
|---|---|---|---|
| 3,395,321 | 7/1968 | Boyer | 317/234 |
| 3,413,532 | 11/1968 | Boyer | 317/234 |
| 3,280,383 | 10/1966 | Emeis | 317/234 |
| 3,226,466 | 12/1965 | Martin | 317/234 |
| 3,377,523 | 4/1968 | Andersson et al. | 317/234 |

FOREIGN PATENTS OR APPLICATIONS

| | | | |
|---|---|---|---|
| 1,000,023 | 8/1965 | Great Britain | 317/234 |

*Primary Examiner*—John W. Huckert
*Assistant Examiner*—Andrew J. James
*Attorney*—J. Wesley Haubner and Albert S. Richardson, Jr.

[57] ABSTRACT

A unitary subassembly which is adapted to be mounted on a heat sink. A pair of bolts is adapted to secure a spring member to the heat sink, and a semiconductor device is captured between the spring member and a retainer. The retainer is releasably fastened to the pair of bolts, whereby the bolts, the spring member, the device, and the retainer form the subassembly in which these parts are properly joined together prior to mounting on the heat sink. A main electrode of the semiconductor device is exposed through the retainer for seating on the heat sink when the unitary subassembly is anchored thereto.

14 Claims, 6 Drawing Figures

INVENTORS:
DANIEL B. ROSSER,
JOHN P. LIVEZEY,

BY Albert S. Richardson Jr.
ATTORNEY

INVENTORS:
DANIEL B. ROSSER,
JOHN P. LIVEZEY,
BY Albert S. Richardson, Jr.
ATTORNEY INVENTORS:
DANIEL B. ROSSER,
JOHN P. LIVEZEY,
BY Albert S. Richardson, Jr.
ATTORNEY

UNITARY HIGH POWER SEMICONDUCTOR SUBASSEMBLY SUITABLE FOR MOUNTING ON A SEPARABLE HEAT SINK

This invention relates to improvements in high power assemblies including semiconductor devices of the kind wherein a broad area semiconductor body is sandwiched under pressure between opposing electrodes of a sealed housing. Such devices are designed to conduct high currents and to block high voltages in a variety of circuits which are well known in the electric power conversion art. Typical devices of this kind comprise in general a semiconductor body in the shape of a multilayer wafer placed between flat metal electrodes joined to opposite ends of a hollow insulator. These main electrodes and insulator form a sealed housing or package for the wafer member, and the complete device is popularly known as a "-cell." A simple rectifier or diode comprises a two layer (PN) silicon wafer, whereas, if a four layer (PNPN) wafer is used, the device is generally known as a controlled rectifier and referred to as a thyristor or SCR.

In using such rectifier and semiconductor devices, it is necessary to provide mechanical support and to allow for connection to an external electrical circuit as well as for dissipation of heat. In order to accomplish this, the cell must be mounted in a pressure assembly which includes a pair of electrical conductors firmly clamped against the main electrodes of the cell, and at least one of these conductors must have associated therewith a suitable heat sink.

Sometimes cells are sold and delivered to a user in an unmounted state. The user may include in the purchase of the cell a group of parts which he could assemble together with a heat sink and provide the required mechanical pressure and electrical connections to the cell. In other cases, the user may prefer to supply his own mounting elements for the purchased cells.

Several problems may be encountered when unmounted cells are sent by the manufacturer to the user. In shipment, or in assembly by the user, different portions of the cell or the separate mounting elements may become nicked, oxidized or otherwise damaged. Such damage may degrade the surfaces of the components thereby reducing the quality of the electrical and thermal interfaces between the cell and the heat dissipation devices or the electrical outlets.

In addition, the pressure assembly process of the various parts is often critical since any misassembly would have the effect of causing inferior contact, decreased current carrying capability and overheating. An additional effect would be possible damage to the cell resulting from improper structural loading which would not allow uniform stress over the entire contact area of the main electrode. Such misassembly may occur due to the inexperience of the user or any other factors which arise when the manufacturer does not perform the final assembly.

Accordingly it is a general objective of the present invention to provide an intermediate subassembly of a cell and its accouterments for unitary handling in a safe and convenient manner without interfering with later mounting, under pressure, of the cell on the heat sink.

In order to accomplish this objective, the subassembly for the high power semiconductor device comprises a spring member having secured thereto engaging members adapted to be secured to a heat sink. A retainer is temporarily fastened to both of the engaging members to form a unitary subassembly with the semiconductor device and the spring member. The retainer allows one of the main electrodes of the semiconductor device to be exposed through the retainer whereby that main electrode engages the heat sink when the engaging members are secured to the heat sink.

Our invention will be better understood and its various objects and advantages will be more fully appreciated from the following description taken in conjunction with the accompanying drawings in which.

Figure 1:
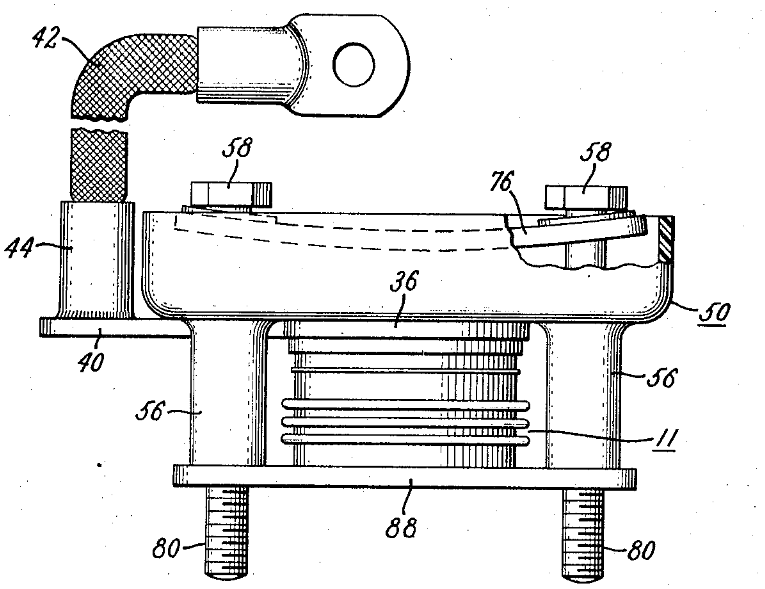
FIG. 1 is an elevational view of a high-power semiconductor controlled rectifier device in a subassembly that embodies our invention.

The rectifier device 11 shown in FIGS. 1–3 will now be described in general terms, with the understanding that, the device itself is not our invention, but the description in general is needed for an understanding of the pressure assembly with which the device is mounted. The present specification will conclude with claims that point out the particular combination we regard as being out invention.

Rectifier 11 has as its main component a disclike body 12 compressed between the flat surface areas 13 and 14 of cup-shaped terminal members, whose rims 15 and 16 are bonded to opposing ends 17 and 18 of a generally cylindrical hollow electrical insulator 19. In this manner there is formed a hermetically sealed, one piece housing for body 12. Body 12 is pressure mounted between the opposing ends of a pair of force transmitting electroconductive thrust members or posts 20 and 21 that will serve as electrical as well as thermal conductors. The associated posts 20 and 21 are generally cylindrical in shape and constructed of a highly conductive metal such as aluminum, brass or copper, preferable the latter due to the high valued thermal conductivity of this material. As shown in FIG. 2, the opposing ends of posts 20 and 21 are tapered to fit inside the cup-shaped terminal members 25 and 26 of device 11 where they are terminated by facing surfaces 28 and 30 respectively. Surface 28 of post 20 generally conforms to and parallels the adjoining external contact surface of the anode 13 of device 11. However, surface 30 of post 21 is spaced from the external contact surface of cathode 14 and a strain buffer 32 preferably made of tungsten is disposed therebetween. In this manner, each of electrodes 13 and 14 of device 11 is electrically and thermally conductively coupled to one of the facing surfaces 28 and 30 respectively of the posts 20 and 21 over a relatively broad area, and thus device 11 is connected electrically in series with these posts 20 and 21. As claimed herein, post 20 and electrode 13 are collectively defined as a first main electrode and post 21, strain buffer 32 and electrode 14 are collectively defined as a second main electrode.

Figure 2:
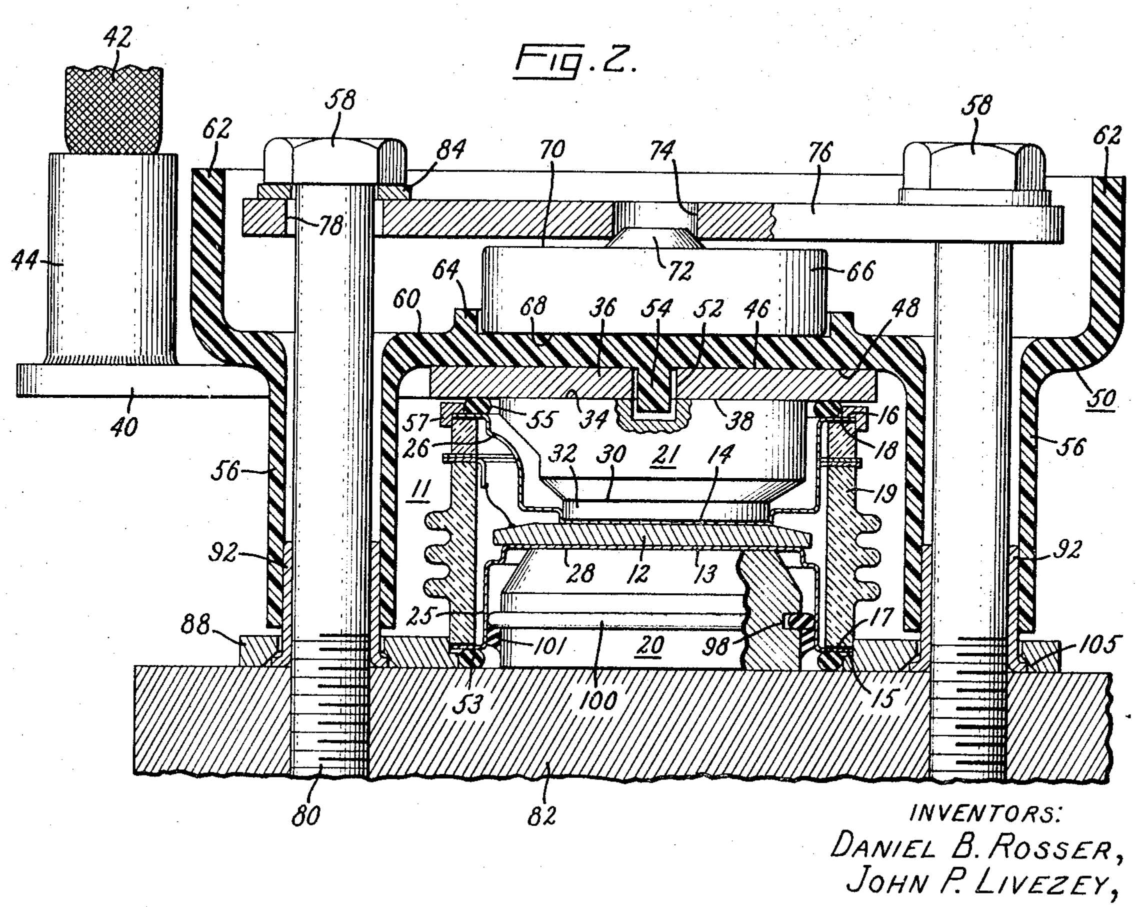
FIG. 2 is a sectional view of the subassembly of FIG. 1 when mounted on a heat sink.
Figure 3:
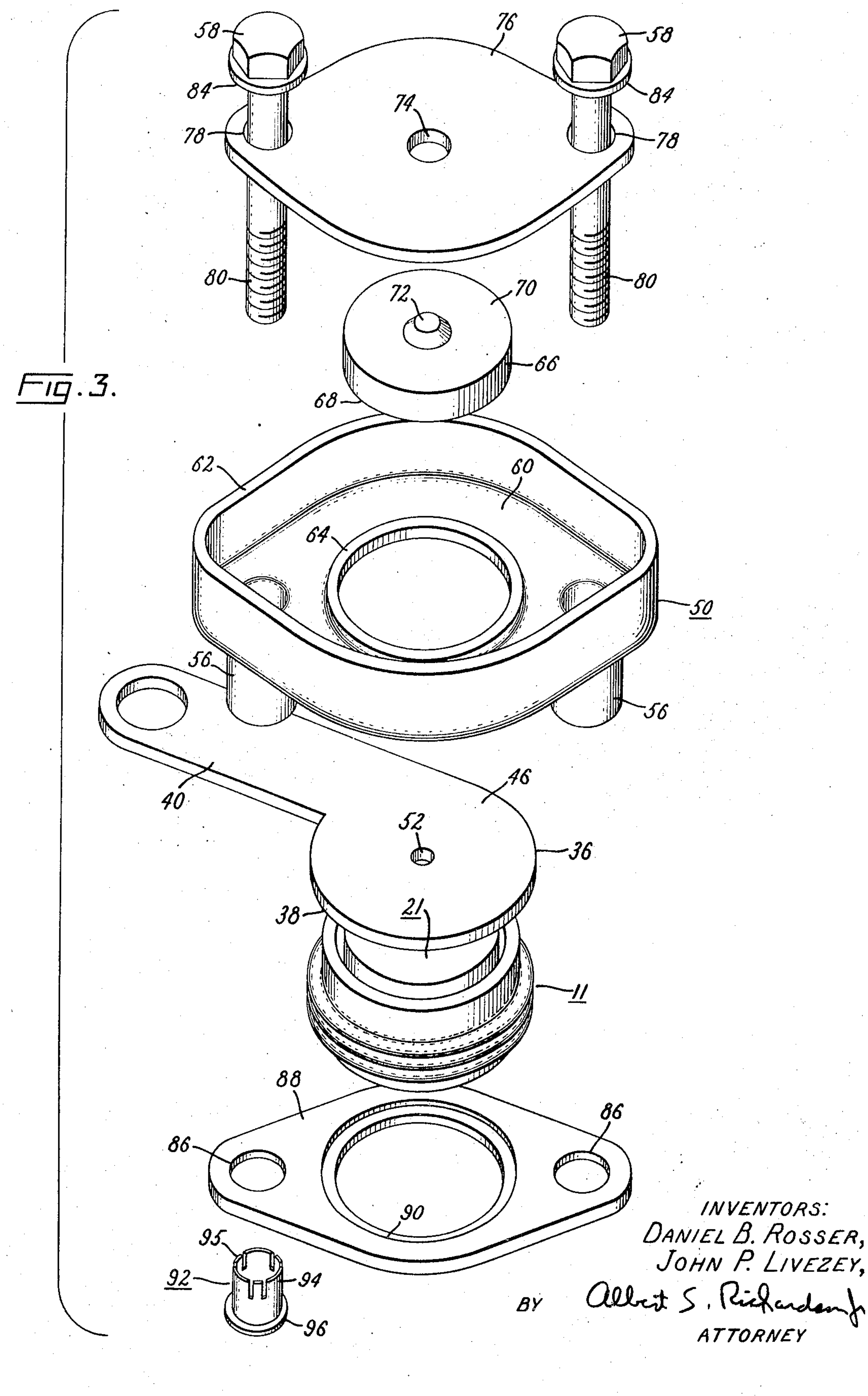
FIG. 3 is an exploded view of the elements comprising the subassembly of FIG. 1.

Post 21, as is shown in FIG. 2, has a surface 30 at one end in contact with strain buffer 32 and a second surface 34 of larger diameter than first surface 30 which engages a flat tang or takeoff 36 which extends in a radial direction outwardly from the axis of post 21. The surface 38 of tang 36 in contact with the second surface 34 is of the same geometric shape of surface 34 and is in pressure contact with said surface. The contact pressure allows for an electrically conductive path extending through tang member 36 to its distal end which is connected by a suitable electric current conductor 42 to an external electric circuit. For example, a crimp connector 44 may be welded in an opening in distal end 40 and a flexible cable 42 crimped into the connector forming the connection.

The other facing contact surface 46 of tang 36 generally conforms to and parallels the lower side or first surface 48 of an insulating cap 50. A transverse opening 52 is formed through tang 36 substantially at the axis of surface 38 of sufficient diameter to allow passage of a cylindrical protuberance 54 formed in surface 48 with opening 52 of diameter large enough to allow tang member 36 to rotate in a singular plane motion about protuberance 54 through an arc approaching in the limit one-half of a complete rotation of tang 36.

To provide electrical insulation the insulating cap 50 is molded of a high temperature polyester-fiberglass in the form of a one piece construction. Tubular end legs 56 extend from surface 48 of insulating cap 50 and are hollow to allow passage of engaging or metal bolt members 58 through the cap 50. Surface 60 forms a base for the vertical sidewall 62 of the cupped surface of cap 50. Inside walls 64 are formed in surface 60 and define a generally closed circular contour. Within inside walls 64 a seat is formed for a solid metallic cylindrical pivot 66 mounted upon the cap 50. Pivot 66 has two opposing surfaces 68 and 70. Surface 68 is machined flat and is fitted within extending walls 64 and in contact with the insulating cap surface 60. Surface 70 is generally flat but has a centrally located protuberance 72 in a conical shaped truncated form. The truncated cone 72 is received within a central opening 74 of a spring member 76 known as a flat spring. Member 76 has a uniform curvature in a direction opposed to that of the plane of the pivot surfaces 68 and 70. Opening 74 is of larger diameter than the smallest diameter of truncated cone 72 but is smaller than the largest diameter thereof. The curvature of the spring 76 is formed to provide the proper loading on the rectifier device 11 when bolts 58 are turned to make the spring 76 generally flat in a manner later to be described.

Bolts or engaging members 58 are joined to the spring 76 by respectively passing them through holes 78 formed in opposite ends of the spring. The bolts 58 continue through respective insulating cap tubular legs 56 and extend outwardly from the end legs. Bolts 58 are each partially threaded 80 over approximately the last third of the length to engage threaded openings of an electroconductive heat sink 82 on which our subassembly is ultimately mounted. In order to allow smooth tightening of bolts 58, washer members 84 are placed in contact with the upper surface of spring 76 and the bolts 58.

Bolts 58 pass through openings 86 at opposite ends of a flat metallic retainer 88. Retainer 88 has a large centrally located opening 90 which is undercut to engage the outer rim of rectifier device 11. Post 20 passes through central opening 90 and is thus exposed for contact with sink 82. In this manner rectifier device 11 can be mounted under pressure between the heat sink 82 and the tang 36.

Figure 4:
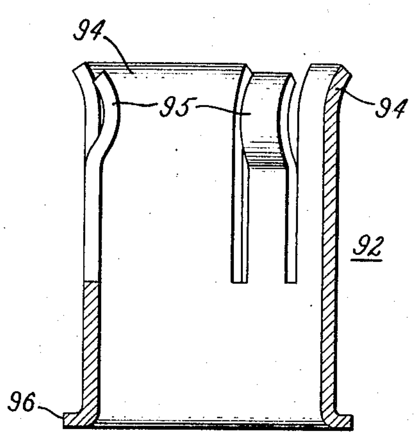
FIG. 4 is a sectional view of a fastener used in the subassembly of FIG. 1.

In order to form a unitary subassembly for shipping and handling purposes prior to mounting on the heat sink 82, retainer 88 is maintained in place by hollow, split, cylindrically shaped fasteners 92 formed of thin spring metal as shown in detail in FIG. 4. Fasteners 92 have outwardly extending resilient fingers 94 to engage the inner wall of the tubular legs 56 and in this manner to provide a friction grip to retain each fastener 92 in the insulating cap legs 56. In addition, each fastener 92 has inwardly extending fingers 95 which resiliently engage a respective bolt 58.

Fingers 94 and 95 are each formed by removing a thin portion or strip of the cylinder wall of the fastener 92 to a depth approximately one-half the wall weight. The upper edge of fingers 94 are each bent away from the axis of fastener 92 to engage a respective leg 56. The upper portions of fingers 95 are each bent to form a circle segment directed inwardly toward the axis of fastener 92 sufficiently to engage a respective bolt 58. The bolts may be turned though they are held in place by the resilient action of fingers 95. Further each fastener 92 has an outwardly turned rim 96 remote from fingers 94 and 95. Rim 96 is received within and engages annular recess 105 formed radially with opening 86 remote from housing leg 56. In this manner retainer 88, rectifier device 11, and tang 36, pivot 66, spring 76, and bolt members 58, are maintained as an integral unit with cap 50.

Figure 5:
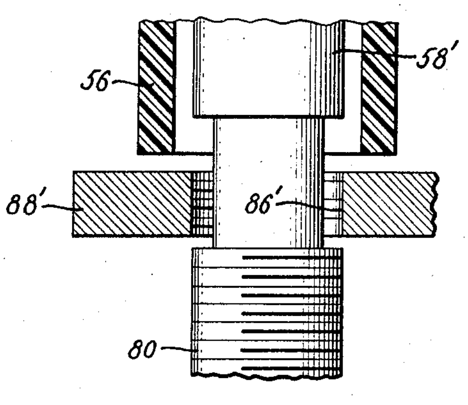
FIGS. 5 and 6 are sectional views of other embodiments of the invention.
Figure 6:
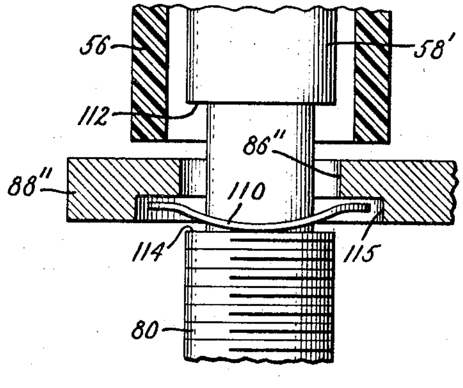

Instead of the fastener 92, a slotted hole type spring washer 110 may be used for releasably fastening the retainer ring 88 to the bolt members, as is shown in the modification of the invention of FIG. 6. For purpose of simplicity only a portion of the structure of FIGS. 1–3 have been shown in the embodiments of FIGS. 5 and 6 and similar parts have been identified by corresponding reference characters. In FIG. 6, the mounting bolt 58′ is undercut to form annular shoulders 112 and 114. In addition, the retainer 88″ is undercut radially with opening 86″ remote from housing tubular leg 56 to form annular recess 115. Recess 115 is of depth sufficient to receive washer 110 in its compression mode which is at least equal to the width of the washer. In addition, recess 115 is of diameter sufficient to receive the outer dimension of washer 110 with some tolerance. It will be understood that with the subassembly in its assembled form, the convex side of washer 110 remote from housing leg 56 engages shoulder 114. It will be understood that shoulder 114 is spaced with respect to leg 56 to provide a partial spring loading of the subassembly and when the subassembly is assembled with sink 82, shoulder 112 will not traverse the opening 86″ in the retainer.

In another embodiment of the invention, as shown in FIG. 5, retainer 88′ is threaded at opening 86′ to receive the threaded portion 80 of undercut bolt 58′. In this manner, a unitary subassembly is formed by threading bolt 58′ through retainer 88′; this operation being performed for each of the bolts.

The peak magnitude of current to which a semiconductor rectifier assembly can be subjected without external flashing is referred to as the "explosion rating" of the assembly. A pair of O-rings 53 and 55 contribute to an exceptionally high explosion rating. The O-ring 55 is axially squeezed between the tang 36 and the rim 16 of the cup 26, and its radial blowout is impeded by a circumscribing metal ring 57 as shown. When the device is finally assembled, the companion O-ring 53 will be compressed in the gap between the heat sink 82 and the rim 17 of the cup 25 of the cell 11, with the retainer member 88 circumscribing this O-ring to impede its blowout.

There is an annular cut 98 in post 20 approximately one-third of the way from heat sink 82 towards the facing contact surface to receive an additional O-ring 100, and cement 101 is placed between cup 25 and post 20 to the depth of O-ring 100 in order to maintain the anode post 20 as an integral part of the subassembly. The O-ring 100 advantageously seals the space inside the cup 25 and prevents dust, oxidation, or the like from contaminating the interface between contact 28 and the main electrode 13 while the subassembly is separate from the heat sink 82 on which it is ultimately mounted.

In order to mount the unitary subassembly on the heat sink 82, the threaded portion 80 of each bolt 58 is turned into a respective threaded opening in sink 82. The bolts 58 are finger tightened until no further motion can be derived from such action, and then a wrench is applied to bolts 58 in order to achieve the correct structural loading. The correct loading is indicated when the curvature of spring 76 is reduced to zero, as is shown in FIG. 2. With bolts 58 thus secured to sink 82, post 20 will be firmly seated on the heat sink, and the main current carrying electrodes of the cell 11 will be clamped under high pressure between the post 20 and the cap 50.

Further, it will be understood that when the spring 76 has been affixed to the heat sink 82 by the bolts 58, the mechanical load is applied through the whole combination of the pivot 66, cap 60, tank 36, post 20, strain buffer 32, semiconductor wafer 12, and post 20. The conical protuberance 72 of the pivot 66 will mate with the aperture 74 in the spring 76 in a manner to ensure that the compression force acting on this combination is axially directed, whereby the pivot 66 uniformly loads the cap 50 with an equal distribution of force all along the flat area of the cap 50 to apply a firm uniform pressure over the broad area junctions of the cooperating parts.

It will now be appreciated that although the retainer ring 88 overlaps the semiconductor device 11 for the purpose of preventing removal thereof from the unmounted subassembly shown in FIG. 1, it has been designed so as not to interfere with the seating of the post 20 on the heat sink 82 when the subassembly is actually mounted (FIG. 2). This result is obtained in the illustrated embodiment of the retainer by providing therein the previously described central opening 90 through which the post 20 can pass and by making the axial dimension of the overlapping lip around the perimeter of this opening smaller than the axial distance that the post extends beyond the outer rim of the device 11. It will also be appreciated that the cylindrical spring clips 92 which respectively embrace the mounting bolts 58 so as to prevent their removal from the leg openings 86 in the retainer 88 will not interfere with turning the bolts in order to anchor the whole subassembly to the heat sink 82. By providing the recesses 105 around the leg openings 86 to accommodate the rims 96 of the respective spring clips 92, we ensure that these fasteners themselves are not a source of interference with the direct engagement of the post 20 and the heat sink 82.

Thus we have created a useful combination which does not detract from the conventional installation and operation of high-power pressure mounted semiconductor assemblies while offering the advantage of maintaining the various parts and pieces of the assembly properly oriented in a unitary structure separate from the bulky heat sink for easier handling but ready for final assembly at the user's convenience.

While we have shown and described several forms of our invention by way of illustration, other modifications will undoubtedly occur to those skilled in the art. For example, tape could be substituted for the spring clips 92. The insulating cup 50 could be omitted if the bolts 58 were the main insulating medium by forming them from a material of high electrical resistance such as fiberglass or plastic throughout or by applying an outer layer of such material to them. The unitary subassembly could be enlarged to include an additional device in series with the illustrated one 11 between the spring 76 and the retainer 88.

What we claim as new and desire to secure by Letters Patent of the United States is:

1. A subassembly adapted to be anchored to a heat sink comprising:
   a. a spring member,
   b. mounting means for securing said spring member to the heat sink,
   c. a semiconductor device having first and second main electrodes adapted to be clamped under pressure on the heat sink by said mounting means and spring member and,
   d. means fastened to said mounting means for temporarily retaining said semiconductor device, said spring member, and said mounting means in a unitary subassembly, said retaining means allowing said first main electrode to be exposed whereby said retaining means does not interfere with said first main electrode being firmly seated on said heat sink when said spring member is secured thereto.

2. The subassembly of claim 1 in which insulating means is provided for electrically decoupling said second main electrode from said mounting means.

3. The subassembly of claim 2 in which said retaining means comprises a retainer which overlaps said device to prevent its removal from the subassembly, said retainer having a centrally located opening to allow through passage of said first main electrode.

4. The subassembly of claim 3 in which said semiconductor device comprises an hermetically sealed cell having a terminal member in broad area contact with an electroconductive post which extends from said terminal member to said heat sink when the subassembly is anchored to the latter, said terminal member and post comprising said first main electrode.

5. The subassembly of claim 3 in which said mounting means comprises first and second bolt members and said retaining means includes means for fastening said retainer to said bolt members without interfering with the turning of said bolt members.

6. The subassembly of claim 5 in which said retainer includes leg openings for receiving said first and second bolt members therethrough and in which said insulating means comprises a one piece insulating cap separating said second main electrode from said bolt members.

7. The subassembly of claim 6 in which said fastening means comprises first and second spring washers for said first and second bolt members respectively, said first and second bolt members each being undercut adjacent said retainer to form a shoulder for engaging a respective spring washer, each spring washer being spring loaded between said shoulder and the side of said retainer remote from said device.

8. The subassembly of claim 7 in which said retainer is undercut on said remote side adjacent said first and second openings a depth at least equal to the thickness of and a diameter sufficient to receive said first and second spring washers respectively.

9. The subassembly of claim 6 in which said insulating cap has first and second end legs for receiving said first and second bolt members respectively, and in which said fastening means comprises first and second spring clips which embrace the respective bolt members and prevent their removal from the leg openings in said retainer.

10. The subassembly of claim 9 in which said first and second spring clips are cylindrical members having outwardly extending fingers which resiliently engage the inner walls of said first and second end legs, respectively.

11. The subassembly of claim 10 in which said first and second spring clips extend through the respective leg openings of said retainer and have outwardly turned rims remote from said fingers to engage said retainer.

12. The subassembly of claim 1 in which said mounting means comprises a pair of members constructed of a material with a low electrical conductivity.

13. The subassembly of claim 1 in which said mounting means comprises a pair of members having outer layers of material having a low electrical conductivity.

14. A subassembly adapted to be anchored to a heat sink comprising:
   a. a semiconductor device having first and second main electrodes each being electrically and thermally conductive,
   b. an insulating cap having first and second opposite surfaces, said first surface having formed therein a first and a second end leg,
   c. a tang member located between said second main electrode and the first surface of said cap,
   d. a pivot member received on the second surface of said cap,
   e. a spring member for pivoting on said pivot member,
   f. first and second bolt members joined to said spring member and extending through said first and second end legs respectively and adapted to be secured to said heat sink,
   g. a retainer member having a centrally located opening smaller than the compass of said device but sufficiently large to allow passage therethrough of its first main electrode, said retainer member having additional openings through which said first and second bolt members respectively pass, and
   h. means for releasably fastening said retainer member to said bolt members to form a unitary subassembly of said semiconductor device, tang member, cap, pivot member, spring member, bolt members, and retainer member,
   i. whereby said main electrodes and said tang member can be clamped under pressure between said cap and said heat sink by securing said bolt members thereto.

* * * * *